United States Patent [19]
Hayashi et al.

[11] Patent Number: 4,894,699
[45] Date of Patent: Jan. 16, 1990

[54] OPTICAL CONTROL CIRCUIT AND SEMICONDUCTOR DEVICE FOR REALIZING THE CIRCUIT

[75] Inventors: Yutaka Hayashi, Ibaragi; Shigeaki Tomonari; Keizi Kakite, both of Osaka, all of Japan

[73] Assignees: Agency of Industrial Science & Technology, Ibaragi; Matsushita Electric Works, Ltd., Osaka, both of Japan

[21] Appl. No.: 302,079

[22] Filed: Jan. 25, 1989

Related U.S. Application Data

[63] Continuation of Ser. No. 87,645, Aug. 19, 1987, abandoned.

[30] Foreign Application Priority Data

Aug. 20, 1986 [JP] Japan .............................. 61-195810

[51] Int. Cl.⁴ ............................................ H01L 27/14
[52] U.S. Cl. ........................................ 357/30; 357/41; 357/58
[58] Field of Search ...................... 357/30 I, 30 G, 58, 357/30 R, 30 PF, 41

[56] References Cited

U.S. PATENT DOCUMENTS

| | | | |
|---|---|---|---|
| 3,486,029 | 12/1969 | Barrett et al. | 250/551 |
| 3,488,523 | 1/1970 | Lynch | 307/311 |
| 3,813,539 | 5/1974 | Sioma | 307/311 |
| 4,110,608 | 8/1978 | Thomson | 250/214 A |
| 4,158,144 | 6/1979 | Krause | 250/551 |
| 4,183,034 | 1/1980 | Burke | 357/30 |
| 4,390,790 | 6/1983 | Rodriguez | 250/551 |
| 4,467,191 | 8/1984 | Chalfin | 250/214 A |
| 4,629,880 | 12/1986 | Zimmermann | 250/551 |
| 4,636,829 | 1/1987 | Greenwood | 357/58 |
| 4,647,794 | 3/1987 | Guajardo | 250/551 |
| 4,665,316 | 5/1987 | Hodges | 250/551 |
| 4,712,017 | 12/1987 | Kamasaki | 250/551 |
| 4,742,380 | 5/1988 | Chang | 357/30 I |

*Primary Examiner*—Martin H. Edlow
*Attorney, Agent, or Firm*—Burns, Doane, Swecker & Mathis

[57] ABSTRACT

An optical control circuit is formed by connecting a photoconductive element and resistive element at their one end to the control electrode of a transistor, while connecting the other end of the photoconductive element to one of output electrodes of the transistor and the other end of the resistive element to a predetermined voltage supply point. With this simple circuit arrangement, an effective input control with respect to the control electrode of the transistor can be realized.

14 Claims, 6 Drawing Sheets

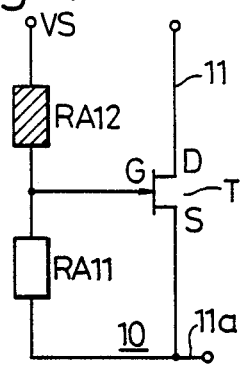
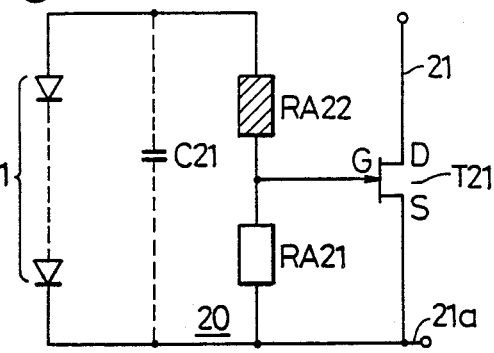
Fig.1
Fig.2
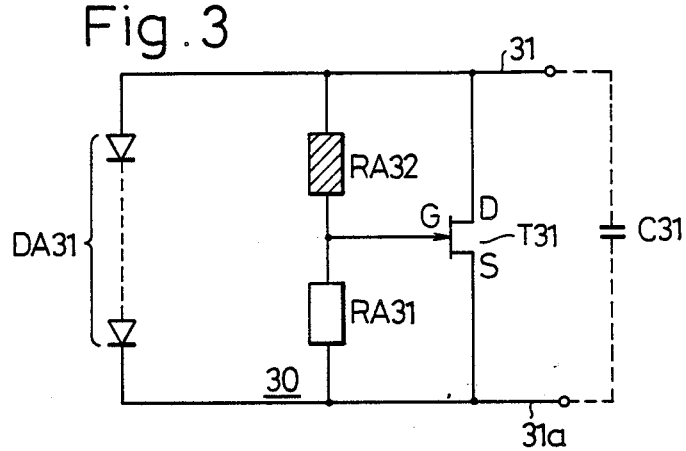
Fig.3
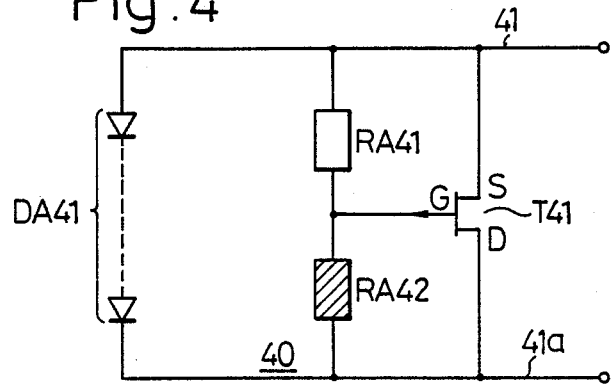
Fig.4

4,894,699

OPTICAL CONTROL CIRCUIT AND SEMICONDUCTOR DEVICE FOR REALIZING THE CIRCUIT

This application is a continuation of application Ser. No. 087,645, filed Aug. 19, 1987 now aband.

TECHNICAL BACKGROUND OF INVENTION

This invention relates to a circuit for optically controlling input and output currents or output voltage of the circuit, as well as to a semiconductor device for realizing such circuit.

The optical control circuit of the kind referred to comprises a transistor having a control electrode and a pair of output electrodes and receiving a photo-voltage generated at such a photovoltaic element as a photovoltaic diode array, an input to the control electrode of which being controlled so that the input and output currents or output voltage at the output electrodes can be effectively controlled.

DISCLOSURE OF PRIOR ART

One of known optical control circuits of the kind as above is disclosed in U.S. Pat. No. 4,390,790 to Edward T. Rodriguez, in which the optical control circuit is formed by connecting a field effect transistor (which shall be hereinafter referred to simply as "FET") of normally ON type in parallel with a first photovoltaic diode array, and a second photovoltaic diode array in parallel across the gate and source of the FET. When in this circuit a light signal from a light emitting element optically coupled to the first photovoltaic diode array is incident upon this diode array, a photo-voltage is generated across both ends of the first photovoltaic diode array, and a current is made to flow. The light signal is received also at the second photovoltaic diode array optically coupled to the light emitting element, simultaneously with the first diode array, a photo-voltage generated across the second diode array is applied to the gate of the normally-ON FET to turn it OFF, and a voltage across output terminals of the FET rises.

As the light emitting element optically coupled to the first and second photovoltaic diode arrays is deenergized, on the other hand, the light signal to the first and second diode arrays is interrupted but the normally-ON FET is turned conductive so that, after the light signal interruption, any electric charge remaining in the first photovoltaic diode array is quickly discharged through the FET in the conductive state while a charge in the second photovoltaic diode array is also quickly discharged through another FET, and the voltage across the output terminals of the normally-ON FET drops quickly.

In the optical control circuit according to the foregoing U.S. patent, however, it is essential that the FET for generating the controlling input and output is the normally ON type, so as not to allow any of such generally available transistors as normally-OFF type FET, bipolar transistors and the like to be employed, and the circuit has been defective in respect of the general usage. As it is still necessary to employ the photovoltaic diodes in two arrays which rendering mutual connection between the diodes to be complicated, there have been involved various troubles due to increased restrictions in circuit designing and manufacturing techniques.

FIELD OF ART

A primary object of the present invention is to provide an optical control circuit which does not restrict the circuit elements to any specific semiconductor elements but rather allows to employ a variety of the elements, realizing the optical control with a simpler circuit arrangement and thus decreasing remarkably the circuit designing and manufacturing restrictions, and also to provide a semiconductor device which can realize such optical control circuit.

The object of the present invention is achievable by means of an optical control circuit which comprises a transistor having a control electrode and a pair of output electrodes and controls the output at the output electrodes by means of an input control to the control electrode of the transistor, wherein a photoconductive element and resistive element are connected at their one end to the control electrode of the transistor, the photoconductive element being connected at the other end to one of the output electrodes, while the resistive element being connected at the other end to a predetermined voltage supplying point.

According to the circuit of the present invention having such arrangement as above, the control of input to the control electrode of the transistor can be realized by such a simpler circuit arrangement that the photoconductive element is connected to the control electrode and one of the output electrodes while the resistive element is connected to the control electrode and the predetermined voltage supplying point, whereby the transistor is not limited to be any specific type but can be selected from a wide range of the type thereof, and the freedom in the circuit designing and manufacturing techniques can be remarkably improved.

In the foregoing arrangement of the optical control circuit, further, a connection of a photovoltaic diode array between the predetermined voltage supply point and the output electrode of the transistor to which the photoconductive element is connected makes it possible to render the circuit extremely effective in allowing a relatively large current to flow between the output electrodes of the transistor only during a transient period in which the light signal to the diode array and photoconductive element is interrupted. This circuit arrangement is effective particularly in such an event where an electric charge is charged and discharged across a capacitive load, such as the gate to source capacitance of a large area metal-oxide-semiconductor field-effect-transistor (MOSFET) and the like, and the charge and discharge between the gate and the source can be further speeded up by connecting, for example, the transistor's output electrodes to the predetermined voltage supply point.

Other objects and advantages of the present invention shall become clear in detailed explanation in the followings of the invention with reference to preferred embodiments thereof such as shown in accompanying drawings.

BRIEF EXPLANATION OF DRAWINGS

FIG. 1 shows the optical control circuit in an embodiment according to the present invention;

FIGS. 2 to 4 show the circuit in other different embodiments of the invention;

Figure 5:
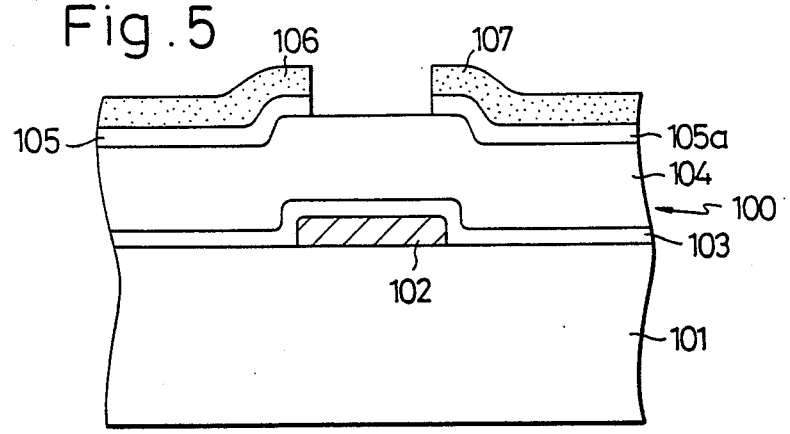
FIGS. 5-7 are respectively a schematic structural view in each of different working aspects of a thin-film transistor employed as one of transistors for the present invention.

While the present invention shall now be explained with reference to the embodiments shown in the accompanying drawings, it should be appreciated that the present invention is not to be limited only to these embodiments but to cover various design modifications possible within the scope of appended claims.

In the present specification, further, the term "photoconductive element" includes, in addition to direct photoconductive elements having photoconductive semiconductor zone which becomes to be of a low resistance upon incident of light signal, part of such photoelectric conversion element s as photodiode. The term "resistive element" should mean those which is less sensitive to the light signal incidence and preferably the one in which the photoconductive element is provided with an optically insulating film, but any photoconductive element different in the variation coefficient of the conductivity from the foregoing photoconductive element can be employed, in which event the photoconductive element is utilizable as it stands without being provided with any light shielding means. It is still possible to use such non-linear elements as diode, transistors and the like.

DISCLOSURE OF PREFERRED EMBODIMENT

Referring to FIG. 1 showing a basic optical control circuit 10 according to the present invention, the circuit 10 comprises preferably such a transistor T11 as a thin film transistor (which shall be referred to hereinafter simply as "TFT"). When FET is employed as this transistor T11, a voltage applied to the gate G forming the control electrode is controlled to thereby control the current flowing across the drain D and source S which are forming the output electrodes. When a bipolar transistor is employed for the transistor T11, on the other hand, the current flowing to the base B forming the control electrode is controlled to thereby control the current flowing between the collector C and the emitter E. However, the explanation shall be made with reference to the case of FET as an example.

Between the gate G and the source S of the transistor T11, a photoconductive element RA11 is connected, while a resistive element RA12 is connected at one end to the gate G of the transistor. The other end of the resistive element RA12 is connected to a predetermined voltage supply point VS of the circuit. Provided here that the transistor T11 is an N-channel FET or an NPN-type transistor, there can be provided from the voltage supply point VS a positive voltage to the control electrode higher than a threshold voltage of the transistor, while this voltage may either be one which varies with time elapsed or one which is substantially always constant.

In the optical control circuit 10 of FIG. 1, the output electrodes of the transistor T11 are also forming output terminals 11 and 11a of the circuit, and the current flowing between the output electrodes is to be controlled with a variation in the voltage applied to the control electrode depending on the intensity of light incident upon the photoconductive element RA11 as the light signal. In an event where the rate of change in the resistance of the photoconductive element would be large, the voltage across the control electrode and one 11a of the output electrodes, that is, the source S of FET, is caused to be decreased below the controlling threshold voltage (gate threshold voltage or base ON voltage) upon the incidence of the light signal. Accordingly, the output current at the output electrodes 11 and 11a can be effectively controlled in response to the presence or absence of the light signal with respect to the photoconductive element.

Referring next to FIG. 2, an optical control circuit 20 in this another embodiment is formed by connecting a photovoltaic diode array DA21 between the predetermined voltage supply point VS in the circuit 10 of FIG. 1 and a junction point of the photoconductive element RA11 with the source S of the transistor T11. All elements shown here and corresponding to those in the embodiment of FIG. 1 are denoted by the same reference numerals as in FIG. 1 but added by 10. In the present instance, the voltage provided at the voltage supply point VS in the embodiment of FIG. 1 is provided by means of a photoelectric current caused to flow in the circuit 20 due to a photovoltaic voltage generated upon incidence of the light signal on the photovoltaic diode array DA21.

When the light signal incident upon the photovoltaic diode array DA21 is interrupted, the voltage provided to the transistor T21 is gradually reduced to be OFF due to that the electric capacity of the photovoltaic diode array DA21 is generally large. If required, this OFF operation of the voltage can be made further gradual by connecting a capacitor C21 in parallel with the diode array DA21 as shown by a broken line in FIG. 2. Shifting time of the photoconductive element RA21 from light resistance to dark resistance can be made smaller than the voltage variation at the voltage supplying point VS, so that the current flowing between the output terminals 21 and 21a of the transistor T21 will take a relatively small value during the presence of light signal incident on the photovoltaic diode array DA21. From the moment of the interruption of the light signal to the photovoltaic diode array DA21 here, the photoconductive element RA21 rapidly increases its resistance and the voltage at the control electrode, i.e., the gate G of the transistor T21 once rises, so that the output of the transistor T21 will once increase but soon decrease to be thereafter made stable at a current smaller than in the event of the incidence of light signal upon the diode array DA21.

When an enhancement type FET or a bipolar transistor is employed as the transistor T21, it becomes possible to form the circuit so that, while the output current of the transistor T21 is zero either during incidence of the light signal or during stationary state of the absence of light signal, the output current of the transistor T21 will be provided between the output electrodes 21 and 21a of the transistor only during a transient time immediately after the interruption of the light signal to the diode array DA 21.

Referring to FIG. 3, next, an optical control circuit 30 in this further embodiment according to the present invention is formed by connecting a junction point between the resistive element RA22 and the photovoltaic diode array DA31 in the circuit 20 of FIG. 2 to one of the output electrodes of the transistor. In this FIG. 3, too, elements corresponding to those employed in the embodiment of FIG. 2 are denoted by the same reference numerals as in FIG. 2 but as added by 10. The present embodiment is extremely useful when a capacitive load C31 is connected between the drain D and the source S of the transistor T31, that is, the output terminals 31 and 31a. In the presence of the light signal to the photovoltaic diode array DA31, a photo-voltage is generated across the diode array DA31 and is supplied to the circuit 30. The photoconductive element RA31 on which the light signal is simultaneously incident turns to a low resistance state whereas the resistive element RA32 is always in a high resistance state irrespective of the presence or absence of the light signal, whereby the potential between the gate G and the source S of the transistor T31 is made to approach to zero and a high resistance state is achieved between the source S and the drain D of the transistor T31. The photocurrent provided from the photovoltaic diode array DA31 either does not flow at all or does only slightly to the transistor T31, so that this current will be supplied to the capacitive load C31 without being uselessly consumed at the transistor T31.

While the output voltage at the output terminals 31 and 31a should desirably attenuated quickly when the incident light signal to the photovoltaic diode array DA31 is interrupted, the capacity of the load C31 or of the photovoltaic diode array DA31 which is set to be large will likely to cause a larger current to flow upon discharge of the load. By designing the circuit 30 so as to render the transient time from the photoconductive state to the dark conductive state of the photoconductive element RA31, the voltage at the gate G of the transistor T31 is made to rise more quickly as compared with a variation in the voltage at one output terminal 31, that is, the voltage variation at the foregoing voltage supply point so as to quickly increase the current flowing between the electrodes of the transistor, and an electric charge accumulated in the capacitive load C31 or in the photovoltaic diode array DA31 can be thereby made to be discharged at a high efficiency. With this arrangement, it is made possible to have the voltage or current varied remarkably more quickly than in the case where the circuit comprising the transistor T31 and photoconductive element RA31 is not present.

It is also possible to insert between the output terminals 31 and 31a such an insulated-gate type FET as a power MOSFET and the like to thereby form a MISFET which performs ON and OFF operations in response to the light signal, in which event, however, the output voltage of the photovoltaic diode array DA31 is required to be set at a level sufficiently higher than the threshold gate voltage of MISFET. On the other hand, the threshold gate voltage of the transistor T31 is set to be at a level sufficiently lower than the threshold voltage of MISFET in order to prevent this MISFET from being made ON by any noise voltage, whereby it is made possible to have the noise voltage clamped with a current flowing to the transistor T31 even when the voltage across the output terminals 31 and 31a is about to be driven to be higher than the threshold gate voltage of MISFET in such event where the noise voltage is caused to be coupled to the output terminals 31 and 31a in the absence of the light signal to the circuit 30.

In another embodiment of the present invention shown in FIG. 4, an optical control circuit 40 should find its usefulness when a PNP or P-channel type transistor is employed as the transistor 41. In contrast to the foregoing embodiment of FIG. 3, the photoconductive element RA41 and resistive element RA42 are connected to the photovoltaic diode array DA41 in reverse relationship thereto so as to have a negative voltage applied to the drain D of the transistor T41, whereby the same output control as in the embodiment of FIG. 3 can be achieved at the output terminals 41 and 41a.

According to another remarkable feature of the present invention, two or more of at least the photoconductive element, transistor and photovoltaic diode array which are forming the optical control circuit are prepared on the same substrate with the same semiconductor material employed, whereby it is made possible to form more than two different elements on the same substrate through the same manufacturing steps, so that the manufacturing efficiency can be improved. In this case, further, it is preferably that the respective elements are formed by means of thin film deposition, while no limitation thereto in particular is intended.

Referring here to FIG. 5, which showing a structure of TFT 100 for use as the transistor forming one of the constituent elements of the foregoing optical control circuit, a substrate 101 is first provided on one surface with a control electrode 102, then respective thin film layers of a first conduction type, e.g., P-type semiconductor layer 103, a relatively low impurity-content semiconductor layer 104 forming a channel zone and a second conduction type, e.g., N-type semiconductor layer separated into two parts 105 and 105a as spaced from each other at portion corresponding to the control electrode 102 are sequentially stacked on the surface of the substrate 101 including the control electrode 102, and thereafter a pair of source electrode 106 and drain electrode 107 are formed on the two second-conduction type semiconductor layer parts 105 and 105a. This TFT 100 is formed for controlling the value of electric current flowing through the semiconductor layer 104 forming the channel zone in response to a voltage applied to the control electrode 102.

Figure 6:
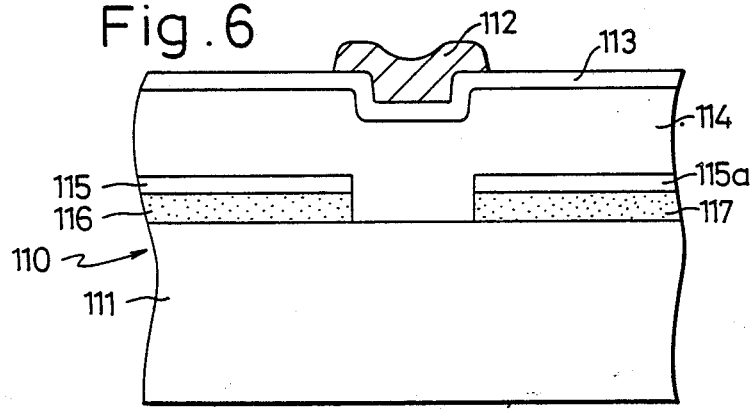

As shown in another embodiment of FIG. 6, a TFT 110 according to the present invention can be also formed by stacking on a surface of a substrate 111 the respective thin films of source and drain electrodes 116 and 117 separated from each other, a pair of second conduction type semiconductor layers 115 and 115a, a channel-zone-forming semiconductor layer 114, a first conduction type semiconductor layer 113 and a control electrode 112 positioned above separated part between the pairs of the semiconductor layers 115, 115a and 116, 117.

Figure 7:
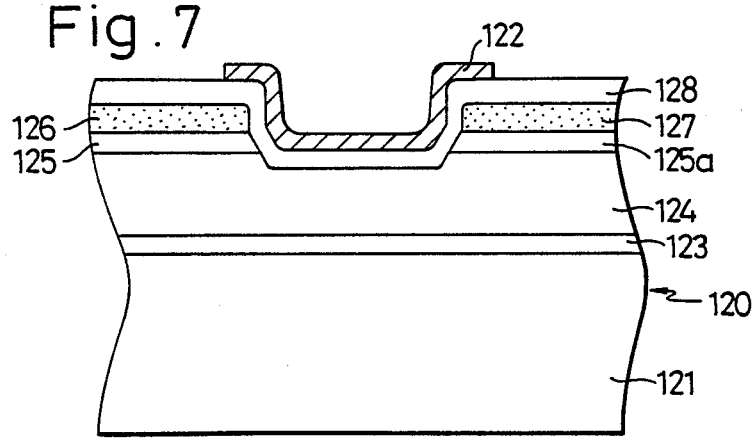

Referring now to FIG. 7, a structure of insulated-gate type TFT which can be employed as the transistor forming an element of the foregoing optical control circuit is shown here. This insulated-gate type TFT 120 comprises sequentially stacked layers on a substrate 121 of a first conduction type, e.g., P-type semiconductor layer 123, a semiconductor layer 124 forming a channel zone, two separated second conduction type, e.g., N- type semiconductor layers 125 and 125a on the layer 124, source and drain electrode layers 126 and 127 on the layers 125 and 125a, an insulation layer 128 formed to cover the channel-zone semiconductor layer 124 of a relatively smaller impurity content as well as the source and drain electrode layers 126 and 127, and a control electrode 122 on the insulation layer 128 so as to ride across the source and drain electrode layers 126 and 127. With this structure of the TFT 120, the value of electric current flowing through the channel-zone semiconductor layer 124 can be controlled by means of a voltage imposed on the control electrode 122.

Figure 8:
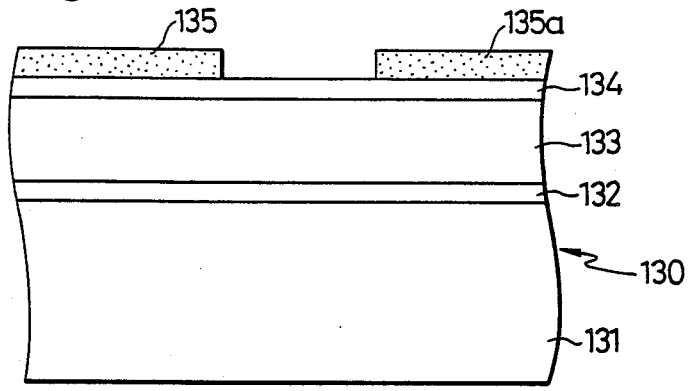
FIGS. 8 and 9 are schematic structural views in different working aspects of the photoconductive element employed in the present invention.

FIG. 8. shows a structure of the photoconductive element employed as one of the constituent elements of the optical control circuit described in the foregoing. This photoconductive element 130 comprises sequentially stacked layers on a substrate 131 of a first conduction type semiconductor layer 132, a semiconductor layer 133 forming a photoconductive zone, a second conduction type semiconductor layer 134, and a pair of mutually separated electrode layers 135 and 135a both formed on the layer 134. When a voltage is applied to the paired electrodes 135 and 135a in this photoconductive element 130, a current is caused to flow through the second conduction type semiconductor layer 134 which is made to be so extremely thin as to be about 100 to 300 Å, and the current tends to pass through the semiconductor layer 133 forming the photoconductive zone. Upon incidence of light, electrons and holes are produced in the layer 133 so as to promote this current flow, so that a low resistance state is achieved between the both electrodes 135 and 135a. This is, with the incidence of light, the electrons generated in the photoconductive-zone semiconductor layer 133 move to the side of an N-type one in the first and second conduction type semiconductor layers 132 and 134, while the assigned generated holes move to the other P-type one in these two semiconductor layers 132 and 132a, so that a less recombination takes place between the electrons and holes, and thus the conductivity is made high between the electrodes 135 and 135a.

When the incident light to the photoconductive-zone semiconductor layer 133 is interrupted, on the other hand, the layer 133 no more generates the electrons and holes, and the conductivity between the electrodes 135 and 135a is made low even when a voltage is applied between these electrodes, because only the second conduction type semiconductor layer 134 becomes capable of passing the electric current.

Figure 9:
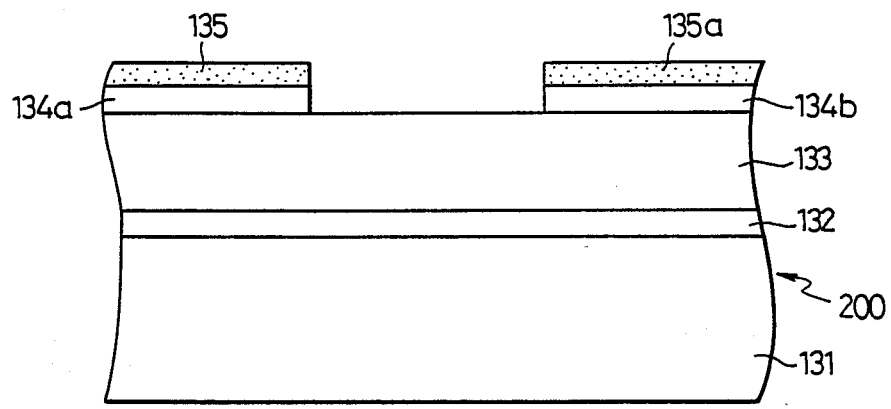

In the above structure of the photoconductive element 130, further, it is possible to provide the second conduction type semiconductor layer 134 in two parts 134a and 134b mutually separated as in a photoconductive element 200 shown in FIG. 9, and to dispose the pair of electrodes 135 and 135a respectively on each of these two separated semiconductor layer parts 134a and 134b, and no such current passing through the second conduction type semiconductor layer 134 as occurring in the case of FIG. 8 upon interruption of the incident light can take place any more due to the separation of the layer 134 to stop the conductivity between the electrodes 135 and 135a upon the incident light interruption. The photoconductive element 200 of FIG. 9 provides, therefore, a clear distinction in the conductivity between the presence and the absence of the incident light, that is, a large light and dark ratio.

Figure 10:
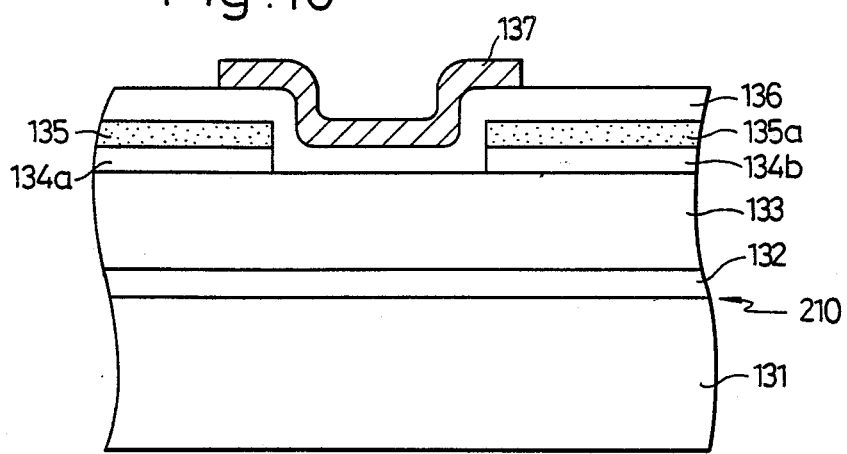
FIG. 10 is a schematic structural view in a working aspect of the resistive element employed in the present invention.

The resistive element can be formed by providing a light shielding and electrically insulating thin film on the surface of the foregoing photoconductive element 130 or 200, or providing on such element an insulating film and further thereon a light shielding thin film. That is, as exemplified in FIG. 10, a resistive element 210 can be formed by first obtaining the same product as the foregoing photoconductive element 200 with the same materials and through the same steps as the latter, and then providing only on the product intended to be formed into the resistive element an insulative film 136 and further thereon such a light shielding thin film 137 of a high reflection factor as a thin Al film so as to ride through the insulative film 136 across the both of the separated electrodes 135 and 135a at their separated position. This is extremely advantageous not only in such respects that the bot different type elements are provided on a common substrate, but also in that relative high and low resistance value relationship of the resistance element can be reversed only by means of the presence or absence of the insulative film 136 and/or the light shielding thin film 137, whereby any precise resistance value regulation or the like working can be made unnecessary and generally the manufacture of the both elements will be made much easier. As will be clear when, for example, FIGS. 5 and 8 are compared with each other, it should be readily appreciated that the common stacking structure of the respective thin films to both of the photoconductive element 130 and TFT 100 allows at least the TFT 100 or 120, photoconductive element 130 and 200 and resistive element 210 can be manufactured simultaneously through the same thin-film semiconductor-layer forming steps since the photoconductive element 130 is of the same thin-film stacking structure as that of TFT 100.

While in the foregoing structure of the photoconductive element the electrodes have been referred to as being formed as the topmost layer, they may be provided even between the substrate and the first conduction type semiconductive layer, and this is commonly applicable to the resistive element of the same structure as the photoconductive element.

Figure 11:
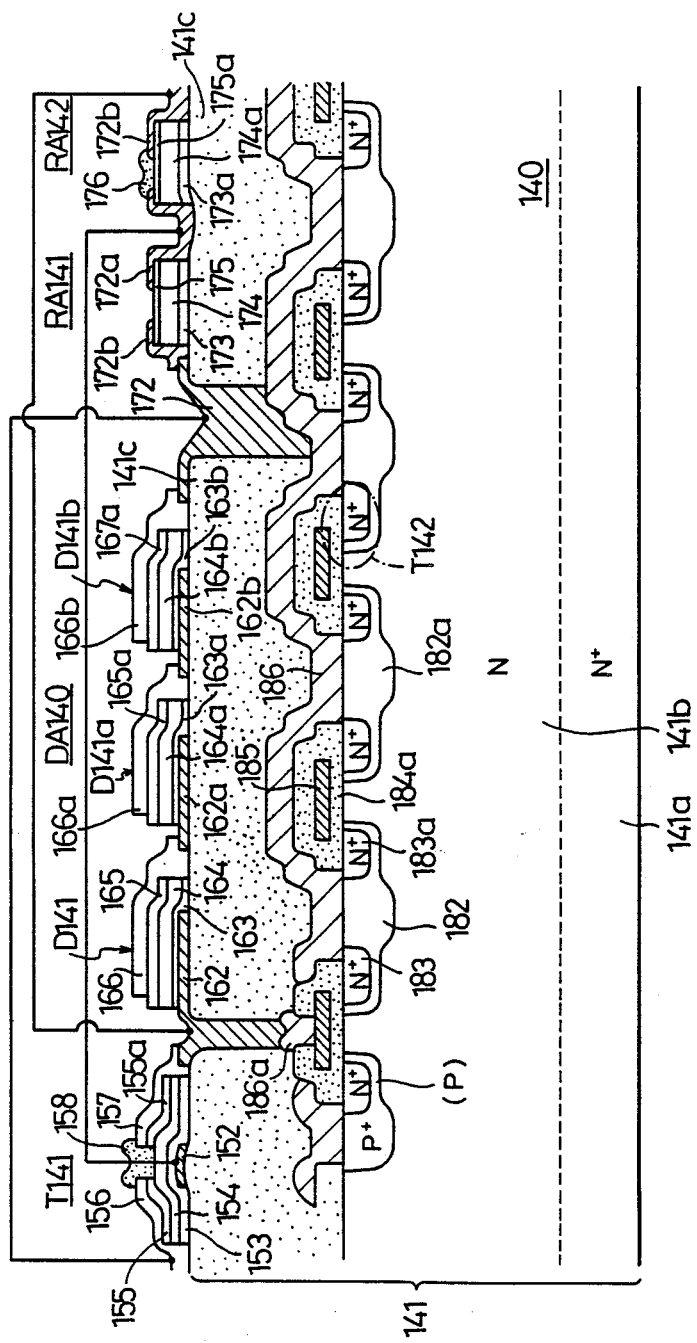
FIG. 11 is a schematic structural view in a working aspect of the semiconductor device which realizes the optical control circuit of the present invention in the form of a light receiving part.

Referring now to FIG. 11, there is shown a semiconductor device 140 which can realize the entire arrangement of the optical control circuit, while the device 140 in this embodiment is shown in the form of a light receiving part of a switching device. In the present instance, a photovoltaic diode array DA140, transistor T141, photoconductive element RA141 and resistive element RA142 are provided substantially along the same plane of upper insulating layer 141c of a substrate 141. That is, the photovoltaic diode array DA140 comprises a plurality (only three of them are shown here simply for brevity) of photovoltaic diodes D141, D141a, D141c..., which are of the same structure and thus the corresponding layers in the diodes D141a and D141b to that in the diode D141 are denoted by the same reference numeral as in the latter but with a suffix "a" or "b". It should be sufficient, therefore, to explain only the photovoltaic diode D141 here.

In forming the photovoltaic diode array DA140 during the manufacture of the semiconductor device 140, an electrically conductive thin film 162 preferably of Ni-Cr, transparent and conductive film or the like is provided on the upper insulating layer 141c in a required number of the photovoltaic diode, and a photovoltaic diode D141 is provided on this thin film 162. The diode D141 comprises a sequential stack of a first conduction type, e.g., P-type semiconductor layer 163 preferably of amorphous silicone or the like which joins with the conductive thin film 162, a semiconductor layer 164 of a low impurity, a second conduction type, e.g., N-type semiconductor layer 165, and a transparent conductive electrode 166 preferably of In$_2$O$_3$ or the like, so that the diode is formed substantially as a PIN-type semiconductor device. In the present case, further, the transparent conductive electrode 166 is brought into contact with the conductive thin film 162a in the adjacent photovoltaic diode D141a, and a photovoltaic diode array DA140 is to be formed by sequentially connecting thus the conductive thin films in the same direction in series.

As will be clear from FIG. 11, further, the diode D141 forming the photovoltaic diode array DA140 is substantially of the same layer structure as the TFT mode transistor T141, photoconductive element RA141 and resistive element RA142, so that it is made possible to form with the same materials and through the same manufacturing steps the control electrode 152, first conduction type semiconductor layer 153, channel-zone-forming semiconductor layer 154, second conduction type semiconductor layers 155 and 155a, source electrode 156 and drain electrode 157 of the transistor T141; as well as the first conduction type semiconductor layers 173, 173a, semiconductor layers 174, 174a forming the photoconductive zone, second conduction type semiconductor layers 175, 175a, an electrode 172a riding across the semiconductor layers 175, 175a of the both elements RA141 and RA 142 and electrodes 172b separated from the electrode 172a. In the present case, the transparent conductive electrode 166b of the last stage diode D141b in the present embodiment is electrically connected through a conductive layer 172 with another electrode 172b of the photoconductive element RA141, a light shielding films 158 and 176 are provided on the upper surface of the transistor T141 and resistive element RA142, and the respective electrodes are mutually connected on the basis of any desired circuit design specification as shown, for example, by solid lines in FIG. 11.

Further, lower part of the substrate 141 comprises a low resistance zone 141a and a high resistance zone 141b which are of a second conduction type, and a plurality of first conduction type P-layers 182 which are impurity zones are formed in upper side area of the high resistance zone 141b as spaced from each other. In each of the P-layers 182, a pair of second conduction type N+-layers 183 and 183a are formed as impurity zones, which are connected with each other while not shown in FIG. 11. On the upper side of the high resistance zone 141b, insulation films 184 are formed respectively to ride across adjacent ones of the P-layers 182 while riding on one of the N+-layers 183 and 183a in each P-layer, and an electrode 185 is formed on the respective insulation films 184 with such material as poly Si or the like. Further, a conductive thin film 186 of Al or the like is formed to cover the surfaces of the respective electrodes 185 and to ride across the respective insulation films 184. With this arrangement, a plurality of double-diffusion type switching elements T142 are formed with the electrode 185 made as an insulated gate G, the N+-layers 183 and 183a as well as the conductive thin film 186 as a source, the N-type high resistance zone 141b around the respective P-layers as a drain, and the P-layers 182 at their part disposed between the N+-layers 183 and 183a and the N-type high resistance zone 141b as a channel. In this double diffusion type switching element T142, its channel length is defined by the thickness of the P-layers 182 disposed between the N-type high resistance zone 141b and the N+-layers 183 and 183a, that is, the diffusion state of the P-layers 182 and N+-layers 183 and 183a into the high resistance zone 141a, so that the channel length can be made shorter without relying on such technique as the photolithography, whereby high voltage withstanding and high-speed operating characteristics can be well obtained. Since in this case a part of the high resistance zone 141b is made to be the drain of the respective switching elements T142, these elements are thereby electrically connected to one another and thus are connected in parallel with each other.

Further, the conductive thin film 162 positioned at initial stage is connected to the drain electrode 157 of the transistor T141 and, through a thin film 186a formed by the same material as that of the conductive thin film 186 simultaneously therewith, to the gate electrode of the switching element T142, while a conductive layer 172 on the last stage side is connected to the conductive thin film 186 on the upper face of the switching element T142.

Figure 12:
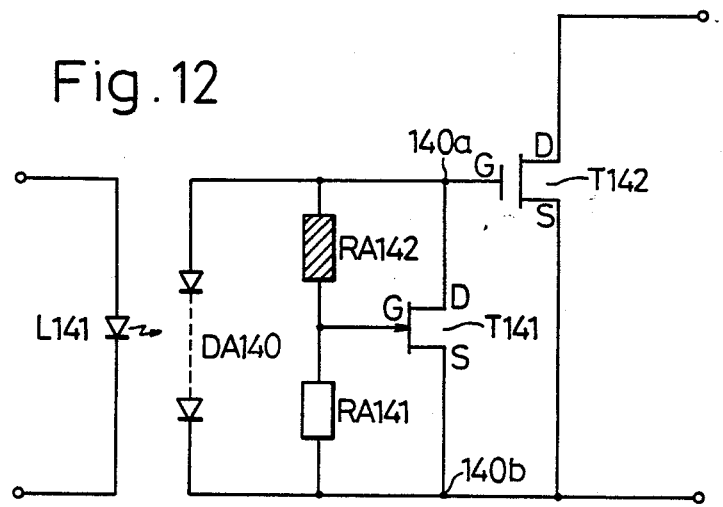
FIG. 12 is a circuit diagram showing in a working aspect of the optical control circuit of the present invention in an application thereof to a semiconductor switching device as a light receiving part thereof.

It will be appreciated here that the semiconductor device 140 shown in FIG. 11 forms such a light receiving section of the switching device that, in practice, the output terminals 31 and 31a of the optical control circuit 30 of FIG. 3 are connected to the gate and source of still another switching element, that is, as shown in FIG. 12, a light receiving section which receives an incident light input from the light emitting element L141 and turns ON and OFF states at the output terminals of the switching element T142 connected at the gate and source to the terminals 140a and 140b. In the circuit shown in FIG. 12, the constituent elements thereof are denoted by the same reference numerals as used in FIG. 11 for their corresponding elements in the device of FIG. 11. With an input signal to the light emitting element L141 and with the thereby emitted light, the latter is made incident on the photovoltaic diode array DA140 and a photovoltage is generated at both ends of the diode array DA140, upon which a voltage is applied across the gate and source of the switching element T142, and ON state is achieved across the drain and source of the switching element T142. When the input to the light emitting element L141 is interrupted, the incident light on the photovoltaic diode array DA140 is also interrupted, and the photovoltage is no more generated, upon which the photoconductive element RA141 turns to a higher resistance state relatively to the resistance element RA142 to turn the state across the source and drain of the transistor (TFT) T141 to be ON, whereby a charge accumulated across the diode array DA140 or the gate and source of the switching element T142 is quickly discharged through the transistor T141, and the state across the output terminals of the semiconductor switching device is turned to be OFF.

Figure 13:
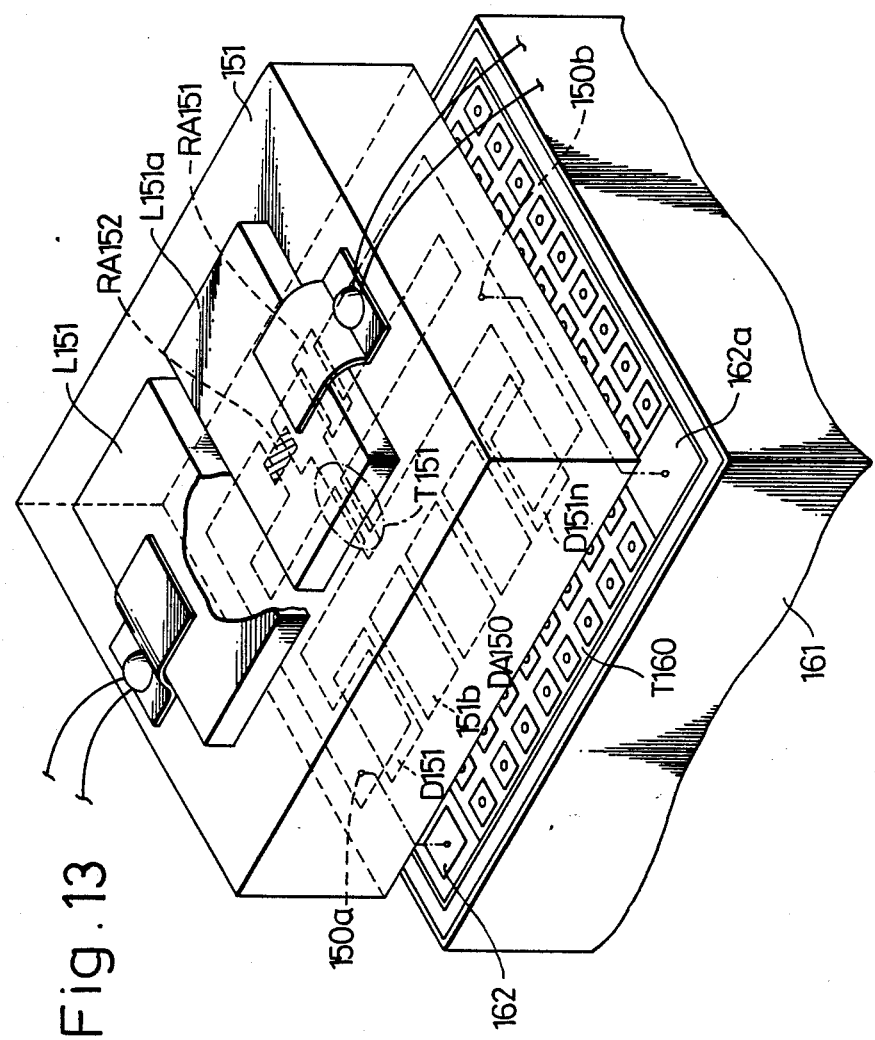
FIG. 13 is a schematic perspective view in a working aspect of a semiconductor device in the form of a photocoupler in which the optical control circuit of the present invention is employed.

Referring now to FIG. 13, there can be provided according to another remarkable feature of the present invention a semiconductor device in an aspect of a unique photo-coupler on the basis of the foregoing semiconductor device that realizes the optical device. In the present embodiment, a substrate 151 is formed by such a transparent insulating material as glass and, on one side surface of this transparent substrate 151, the same photovoltaic diode array DA150 of photovoltaic diodes D151 to D151n, transistor T151, photoconductive element RA151 and resistive element RA152 as the respective corresponding elements disclosed with reference to the embodiment of, for example, FIG. 11 are provided through, if required, the same forming steps as in the embodiment of FIG. 11. Further, on the other side surface of the transparent substrate 151, light emitting elements L151 and L151a are provided to be optically coupled through the transparent substrate 151 to the photovoltaic diode array DA150 or the photoconductive element RA151.

Electrodes 150a and 150b led out of the circuit including the light receiving elements provided on the transparent substrate 151 are connected to electrodes 162 and 162a on another semiconductor substrate 161 to be associated with the substrate 151, and a plurality of such switching elements T160 as in the embodiment of, for example, FIG. 11 are provided on the semiconductor substrate 161.

With this arrangement, the emitted light from the light emitting elements L151 and L151a is made incident, through the transparent substrate 151, reliably upon the photovoltaic diode array DA150 and photoconductive element RA151, while electric insulation between the light emitting elements L151 and L151a and the circuit including the light receiving elements is sufficiently achieved, and such operation as has been detailed with reference to FIG. 12 can be reliably performed.

According to the present invention, a variety of design modifications can be made within the scope of the appended claims. While, for example, the number of the thin films forming the transistor has been referred as being equal to that for the photovoltaic elements, the number of the thin films for the transistor may be properly increased or decreased. Further, the respective elements of the photovoltaic diode array have been referred to as being of the PIN-type, they may be provided by means of PN-junction. The first conduction type referred to as being P-type and the second conduction type as being N-type also may be reversed.

We claim as our invention:

1. A semiconductor device comprising at least two different semiconductor devices taken from a group consisting of a photoconductor, a resistor, and a transistor, said two different semiconductor devices each comprising and being operatively connected through an identical semiconductor layer structure of a first conduction type semiconductor layer, a low impurity concentration semiconductor layer, and a second conduction type semiconductor layer stacked in that order on a substrate, wherein one of said two different semiconductor devices further comprises a pair of mutually separated electrode layers stacked on said second conduction type semiconductor layer to form first and second conductive electrodes, said second conduction type semiconductor layer comprises mutually separated first and second parts, and said first and second conductive electrodes are provided in contact with said first and second parts of said second conduction type semiconductor layer.

2. The device of claim 1, wherein said one of said two different semiconductor devices is said photoconductor realized by a resistance value of said relatively low impurity concentration semiconductor layer varying upon incidence of light.

3. The device of claim 1, wherein said one of said two different semiconductor devices is said resistor, further comprising means for shielding light from an area between said first and second parts of said second conduction type semiconductor layer.

4. The device of claim 1, wherein said one of said two different semiconductor devices is said transistor, further comprising a control electrode formed on said substrate in contact with said first conduction type semiconductor layer at an area corresponding to an area between said first and second conductive electrodes, said relatively low impurity concentration semiconductor layer forming a channel zone, an electric current through which is controlled by an electric voltage applied to said control electrode.

5. The device of claim 1, wherein said one of said two different semiconductor devices is said resistor, further comprising means for shielding light from an area between said first and second conductive electrodes.

6. The device of claim 1, further comprising at least one of each of said group of semiconductor devices including said photoconductor, said resistor, and said transistor.

7. The device of claim 6, further comprising an array of photoconductive elements connected in parallel with said transistor, said control electrode of said transistor being connected to said photoconductor and said resistor.

8. The device of claim 7, further comprising a switching element having a gate and a source between which said transistor is connected.

9. The device of claim 8, wherein said substrate is transparent and electrically insulating, light being made incident on the device through the transparent substrate.

10. The device of claim 5, wherein said photoconductor further comprises a pair of mutually separated electrode layers stacked on said second conduction type semiconductor layer to form first and second conductive electrodes, a resistance value of said relatively low impurity concentration layer varying upon incidence of light.

11. The device of claim 10, wherein said resistor further comprises means for shielding light from an area between said first and second parts of said second conduction type semiconductor layer.

12. The device of claim 11, wherein said transistor further comprises a control electrode formed on said substrate in contact with said first conduction type semiconductor layer at an area corresponding to an area between said first and second conductive electrodes, said relatively low impurity concentration semiconductor layer forming a channel zone, an electric current through which is controlled by an electric voltage applied to said control electrode.

13. The device of claim 12, further comprising a switching element having a gate and a source between which said transistor is connected.

14. The device of claim 13, wherein said substrate is transparent and electrically insulating, light being made incident on the device through the transparent substrate.

* * * * *